United States Patent
Ha et al.

(10) Patent No.: US 10,431,312 B2
(45) Date of Patent: Oct. 1, 2019

(54) NONVOLATILE MEMORY APPARATUS AND REFRESH METHOD THEREOF

(71) Applicant: Winbond Electronics Corp., Taichung (TW)

(72) Inventors: Im-Cheol Ha, Taichung (TW); Shang-Wen Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/959,304

(22) Filed: Apr. 23, 2018

(65) Prior Publication Data

US 2018/0322931 A1 Nov. 8, 2018

(30) Foreign Application Priority Data

May 4, 2017 (CN) .......................... 2017 1 0307482

(51) Int. Cl.
| | | |
|---|---|---|
| *G11C 16/34* | (2006.01) | |
| *G11C 16/04* | (2006.01) | |
| *G11C 7/08* | (2006.01) | |
| *G11C 7/10* | (2006.01) | |
| *G11C 16/28* | (2006.01) | |

(52) U.S. Cl.
CPC .......... *G11C 16/3418* (2013.01); *G11C 7/08* (2013.01); *G11C 7/1063* (2013.01); *G11C 16/0483* (2013.01); *G11C 16/28* (2013.01); *G11C 16/3459* (2013.01)

(58) Field of Classification Search
CPC .... G11C 16/3418; G11C 7/08; G11C 16/0483
See application file for complete search history.

(56) References Cited

U.S. PATENT DOCUMENTS

| | | | | |
|---|---|---|---|---|
| 6,636,440 | B2* | 10/2003 | Maayan ............. | G11C 16/3418 365/185.02 |
| 7,697,359 | B2* | 4/2010 | Lee ..................... | G11C 16/3431 365/222 |
| 8,804,436 | B1* | 8/2014 | Chan .................. | G11C 16/3431 365/185.22 |
| 2008/0068912 | A1 | 3/2008 | Lee | |
| 2014/0029367 | A1 | 1/2014 | Jung et al. | |

FOREIGN PATENT DOCUMENTS

| | | |
|---|---|---|
| CN | 101276640 | 10/2008 |
| TW | I537957 | 6/2016 |

* cited by examiner

*Primary Examiner* — Tri M Hoang
(74) *Attorney, Agent, or Firm* — JCIPRNET

(57) ABSTRACT

A non-volatile memory apparatus and a refresh method thereof are provided. A control circuit determines whether threshold voltages of memory cells in a memory sectors are larger than a refresh read reference voltage and smaller than a refresh program verify reference voltage, and the control circuit determines that a memory cell needs refreshing if the threshold voltage of the memory cell is larger than the refresh read reference voltage and smaller than the refresh program verify reference voltage.

9 Claims, 3 Drawing Sheets

NONVOLATILE MEMORY APPARATUS AND REFRESH METHOD THEREOF

CROSS-REFERENCE TO RELATED APPLICATION

This application claims the priority benefit of China application serial no. 201710307482.9, filed on May 4, 2017. The entirety of the above-mentioned patent application is hereby incorporated by reference herein and made a part of this specification.

BACKGROUND OF THE INVENTION

1. Field of the Invention

The invention relates to a memory apparatus and particularly relates to a non-volatile memory apparatus and a method of refreshing the non-volatile memory apparatus.

2. Description of Related Art

A conventional flash memory includes a plurality of memory blocks. All memory cells in a physical block are disposed in a well structure and share a well control signal. In each physical block are a plurality of exclusive bit lines and word lines. Each of the memory cells is in a position where a bit line and a word line crisscross for addressing.

A threshold voltage of the flash memory is set up by applying a voltage to a memory cell, and a level of the threshold voltage represents data stored in the memory cell. Applying different voltages to a gate of the selected memory cell may verify the level of the threshold voltage of the memory cell after the memory cell is programmed, erased and overly erased. In general, the flash memory is erased before the data are programmed. If a moderate reverse bias voltage is applied to a non-selected portion of the physical block, the physical block is partially erased. However, this situation disturbs the erasure of memory cells in a non-selected block, and erroneous data arise, so it is necessary to refresh the memory cells in the non-selected block one by one to ensure that the stored data are correct. In this manner, it takes longer time for the memory cells to operate, so a low efficiency of refreshing arises. Moreover, in the process of refreshing, the threshold voltages of the surrounding memory cells are changed due to the disturbance of programming. In addition, refreshing a memory cell having a lower threshold voltage, a light threshold voltage or a low transduction value may cause the problems of a deficiency in a driving voltage of the bit lines, poorer characteristics of storage of data and erroneous refreshed data.

In addition, the flash memory has limited frequencies of being erased and programmed. With an increase in the frequencies of being erased and programmed, the flash memory grows older step by step. As the flash memory grows older, it takes longer time to program or erase a memory cell until a desired threshold voltage of the memory cell is obtained.

SUMMARY OF THE INVENTION

The invention provides a nonvolatile memory apparatus and a method of refreshing the nonvolatile memory apparatus capable of heightening an efficiency of refreshing the nonvolatile memory apparatus effectively to ensure that the stored data are correct after refreshing.

The non-volatile memory apparatus according to the embodiments of the invention includes a non-volatile memory and a control circuit. The control circuit is coupled to the non-volatile memory and refreshes a non-selected block when an erasing operation is performed. The non-selected block includes a plurality of memory sectors, each of the memory sectors includes a plurality of memory cells, and the control circuit determines whether threshold voltages of the memory cells in the memory sectors are larger than a refresh read reference voltage and smaller than a refresh program verify reference voltage. The control circuit determines that a memory cell needs refreshing if the threshold voltage of the memory cell is larger than the refresh read reference voltage and smaller than the refresh program verify reference voltage.

According to an embodiment of the invention, the control circuit further determines whether a first memory sector to which a current address corresponds includes the memory cell having the threshold voltage larger than the refresh read reference voltage and smaller than the refresh program verify reference voltage. If the first memory sector to which the current address corresponds does not include the memory cell having the threshold voltage larger than the refresh read reference voltage and smaller than the refresh program verify reference voltage, a refresh operation of the remaining memory sectors in the non-selected block is skipped to complete the refresh operation of the non-selected block.

According to an embodiment of the invention, if the first memory sector to which the current address corresponds includes the memory cell having the threshold voltage larger than the refresh read reference voltage and smaller than the refresh program verify reference voltage, the control circuit refreshes the first memory cell that needs refreshing in the memory sector and in the remaining memory sectors to which the current address corresponds.

According to an embodiment of the invention, the control circuit determines whether the memory cells need refreshing in a batch manner.

According to an embodiment of the invention, the control circuit includes a plurality of sense circuits, and each of the sense circuits includes a first sense amplifier, a second sense amplifier and a refresh enable circuit. A positive input end and a negative input end of the first sense amplifier receive a sensed voltage corresponding to stored data of a target sensed memory cell and a first reference voltage, respectively. A positive input end and a negative input end of the second sense amplifier receive the corresponding sensed voltage and a second reference voltage. The refresh enable circuit is coupled to the first sense amplifier and the second sense amplifier and outputs a refresh enable signal which enables the control circuit to refresh the target sensed memory cell according to a comparison result of the first sense amplifier and the second sense amplifier.

According to an embodiment of the invention, the control circuit further includes a flag signal generation circuit generating a flag signal according to the refresh enabling signal output by the sensed circuit. The control circuit determines whether any of the memory cells to which the sense circuit correspond needs refreshing according to the flag signal.

According to an embodiment of the invention, the flag signal generation circuit includes a NAND gate circuit, an inverting gate, and a latch circuit. An input end of the NAND gate circuit receives the refresh enable signal output by the sense circuits, an input end of the inverting gate is coupled to an output end of the NAND gate circuit, and a latch circuit is coupled to an output end of the inverting gate to latch an output signal of the inverting gate and generate the flag signal.

A method of refreshing a non-volatile memory apparatus according to the embodiments of the invention is suitable for refreshing a non-selected block when an erasing operation is performed, the non-selected block includes a plurality of memory sectors, and each of the memory sectors includes a plurality of memory cells. The method of refreshing the non-volatile memory apparatus includes determining whether threshold voltages of the memory cells in the memory sectors are larger than a refresh read reference voltage and smaller than a refresh program verify reference voltage and determining that a memory cell needs refreshing if the threshold voltage of the memory cell is larger than the refresh read reference voltage and smaller than the refresh program verify reference voltage.

According to an embodiment of the invention, the method of refreshing the non-volatile memory apparatus includes determining whether a first memory sector to which a current address corresponds includes the memory cell having the threshold voltage larger than the refresh read reference voltage and smaller than the refresh program verify reference voltage, skipping a refresh operation of the remaining memory sectors in the non-selected block and completing the refresh operation of the non-selected block if the first memory sector to which the current address corresponds does not include the memory cell having the threshold voltage larger than the refresh read reference voltage and smaller than the refresh program verify reference voltage.

According to an embodiment of the invention, if the first memory sector to which the current address corresponds includes the memory cell having the threshold voltage larger than the refresh read reference voltage and smaller than the refresh program verify reference voltage, the memory cell that needs refreshing in the first memory sector and in the remaining memory sectors is refreshed to which the current address corresponds.

According to an embodiment of the invention, the method of refreshing the non-volatile memory apparatus includes determining whether the memory cells need refreshing in a batch manner.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
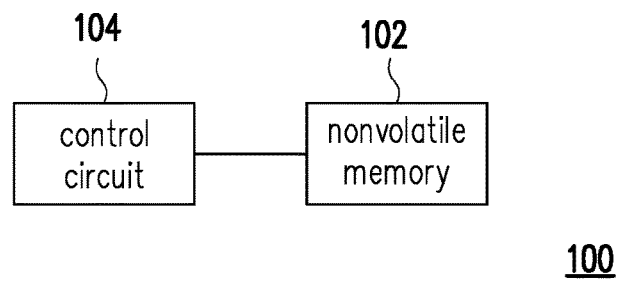
FIG. 1 is a schematic view of a non-volatile memory apparatus according to an embodiment of the invention.

FIG. 1 is a schematic view of a non-volatile memory apparatus according to an embodiment of the invention. Referring to FIG. 1, a non-volatile memory apparatus 100 includes a non-volatile memory 102 and a control circuit 104. The non-volatile memory 102 includes many memories and may be, for example, a flash memory (like an NOR flash memory, but the example is not limited thereto). The control circuit 104 is coupled to the non-volatile memory 102 and performs a memory operation on the non-volatile memory 102 such as a programming operation, an erasing operation, a partially erasing operation, a reading operation and such like. When the control circuit 104 performs the partially erasing operation, steps of pre-programming, partial erasure, subsequent programming and refreshing are carried out sequentially. Specifically, the step of pre-programming is to program data "0" in all selected blocks. Afterwards, the step of partial erasure is to erase memory cells in the selected block, i.e. the memory cells where the data "0" is programmed in advanced, to be in state of data "1". Since during the process of erasure, some of the memory cells could be overly erased, and leakage of electricity arises, it requires the step of subsequent programming to restore an overly erased memory unit to be in a normal state where the data "1" are stored. However, the implementation of the partial erasure could disturb the erasure of the memory cells in a non-selected block in a common well region, so it requires the step of refreshing to read the data stored by the memory cells in the non-selected block and program the data again.

The non-selected block may include a plurality of the memory sectors, and each of the memory sectors may include a plurality of the memory cells. In an embodiment, when the control circuit 104 refreshes the non-selected block, If the threshold voltage of a memory cell is larger than the refresh read reference voltage and smaller than the refresh program verify reference voltage, the control circuit 104 determines that the memory cell needs refreshing. Conversely, if the threshold voltage of the memory cell is neither larger than the refresh read reference voltage and nor smaller than the refresh program verify reference voltage (that is, the threshold voltage of the memory cell is not between the refresh read reference voltage and the refresh program verify reference voltage), the control circuit 104 may determine that the memory cell does not need refreshing.

Figure 2:
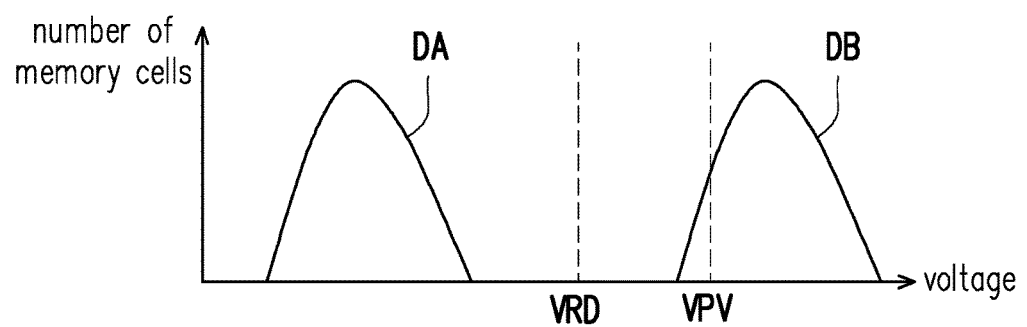
FIG. 2 is a schematic view of threshold voltage distribution of memory cells in a non-selected block according to an embodiment of the invention.

For example, FIG. 2 is a schematic view of threshold voltage distribution of the memory cells in the non-selected block according to an embodiment of the invention. Referring to FIG. 2, assuming that the threshold voltage distribution of the memory cells in an erasure state is threshold voltage distribution DA, and the threshold voltage distribution of the memory cells in a programming state is threshold voltage distribution DB, a refresh read reference voltage VRD is designed to be between the threshold voltage distribution DA and threshold voltage distribution DB, and a refresh program verify reference voltage VPV is designed to be higher than a refresh read reference voltage VRD, for example, in a position slightly higher than a border of the threshold voltage distribution DB. It is noteworthy that the refresh read reference voltage VRD and the refresh program verify reference voltage VPV are not limited to the embodiment, and modifications may be made based on a designer's needs.

The control circuit 104 may determine whether the threshold voltages of the memory cells in the memory sectors are larger than the refresh read reference voltage VRD and smaller than the refresh program verify reference voltage VPV. If the threshold voltage of a memory cell is larger than the refresh read reference voltage VRD and smaller than the refresh program verify reference voltage VPV, the control circuit 104 determines that the memory cell needs refreshing. If the threshold voltage of the memory cell is not between the refresh read reference voltage VRD and the refresh program verify reference voltage VPV, the control circuit 104 determines that the memory cell does not need refreshing. Since refreshing the memory cell having a lower threshold voltage, a higher threshold voltage or a low transduction value could lead to the problems of a deficiency in a driving voltage of bit lines, poorer characteristics of data storage and erroneous refreshed data, refreshing only the memory cell having the threshold voltage falling within the refresh read reference voltage VRD and the refresh program verify reference voltage VPV may effectively prevent the refreshed memory cell from storing erroneous data. In addition, if memory cells having the threshold voltage falling outside a voltage range of the refresh read reference voltage VRD and the refresh program verify reference voltage VPV are not refreshed, it is possible to shorten required time of a refresh operation and heighten an efficiency of refreshing the non-volatile memory apparatus.

It is noteworthy that in some embodiments, the control circuit 104 may further determine whether a first memory sector to which a current address corresponds includes a memory cell having the threshold voltage larger than the refresh read reference voltage and smaller than the refresh program verify reference voltage. When the first memory sector to which the current address corresponds does not include the memory cell having the threshold voltage larger than the refresh read reference voltage and smaller than the refresh program verify reference voltage, that is, none of the threshold voltages of all the memory cells in the first memory sector to which the current address corresponds is between the refresh read reference voltage and the refresh program verify reference voltage, the control circuit 104 may also directly skip the refresh operation of the remaining memory sectors in the non-selected block to complete the refresh operation of the non-selected block. Therefore, it is possible to further shorten required time of the refresh operation and heighten the efficiency of refreshing the non-volatile memory apparatus. If the first memory sector to which the current address corresponds includes the memory cell having the threshold voltage larger than the refresh read reference voltage and smaller than the refresh program verify reference voltage, it is necessary to perform the refresh operation on the first memory sector and on the remaining memory sectors to which the current address corresponds such as refreshing the memory cell that needs refreshing in the memory sectors. After the refresh operation of the memory sector to which the current address corresponds is completed, the control circuit 104 then determines whether memory cells in a memory sector to which a next address corresponds needs refreshing, and the refresh operation is performed until the refresh operation of the non-selected block is completed.

Figure 3:
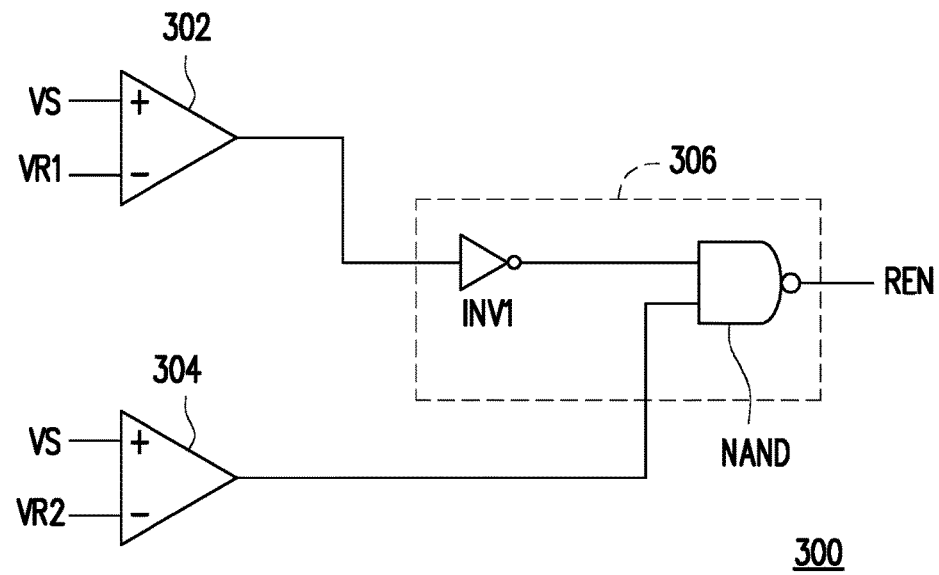
FIG. 3 is a schematic view of a sensed circuit according to an embodiment of the invention.

Furthermore, the control circuit 104 may include, for example, a sense circuit. The sense circuit may determine whether a corresponding target sensed memory cell needs refreshing according to whether a sensed voltage of the stored data of the corresponding target sensed memory cell is between a first reference voltage and a second reference voltage. FIG. 3 is a schematic view of a sense circuit according to an embodiment of the invention. Referring to FIG. 3, a sense circuit 300 may include sense amplifiers 302 and 304 and a refresh enable circuit 306. A positive end and a negative end of the sense amplifier 302 receives a sensed voltage VS of the target sensed memory cell and a first reference voltage VR1 respectively. A positive end and a negative end of the negative amplifier 304 receive the sensed voltage VS of the target sensed memory cell and a second reference voltage VR2 respectively. Voltage values of the first reference voltage VR1 and the second reference voltage VR2 may be set up with reference to the refresh read reference voltage VRD and the refresh program verify reference voltage VPV, but the invention is not limited thereto. The designer may also set up the voltage values of the first reference voltage VR1 and the second reference voltage VR2 based on actual needs.

In addition, the refresh enable circuit 306 is coupled to output ends of the sense amplifier 302 and the sense amplifier 304 and outputs a refresh enable signal REN configured to enable the control circuit 104 to refresh the target sensed memory cell according to a comparison result of the sense amplifier 302 and the sense amplifier 304. The refresh enable circuit 306 may be performed as a logic circuit. For example, the refresh enable circuit 306 according to the embodiments may include an inverting gate INV1 and a NAND gate NAND1. An input end and an output end of the inverting gate INV1 are coupled to an output end of the sense amplifier 302 and an input end of the NAND gate NAND1, the other end of the NAND gate NAND1 is coupled to an output end of the sense amplifier 304, and an output end of the NAND gate NAND1 is configured to output the refresh enable signal REN. Assuming that the first reference voltage VR1 and the second reference voltage VR2 according to the embodiments may be set as 5 volts and 7 volts respectively, the output of the sense amplifier 302 and the sense amplifier 304 belongs to a low voltage level (logic "1") when a value of the sensed voltage VS is smaller than 5 volts. Therefore, the refresh enable circuit 306 outputs the refresh enable signal REN with the logic "1" to prevent the control circuit 104 from refreshing the corresponding target sensed memory cell. When the value of the sensed voltage VS is larger than 7 volts, outputs of the sense amplifier 302 and the sense amplifier 304 belongs to a high voltage level (logic "0"). Therefore, the refresh enable circuit 306 outputs the refresh enable signal REN with the logic "1" to prevent the control circuit 104 from refreshing the corresponding target sensed memory cell in the same way. When the value of the sensed voltage VS is between 5 and 7 volts, the outputs of the sense amplifier 302 and the sense amplifier 304 belongs to the high voltage level (the logic "0") and the low voltage level (the logic "1"). Therefore, the refresh enable circuit 306 outputs the refresh enable signal REN with the logic "0" to enable the control circuit 104 to refresh the corresponding target sensed memory cell. It is noteworthy that the refresh enable circuit 306 according to the embodiments is merely an exemplary embodiment. The refresh enable circuit 306 may also be performed through different combinations of logic gates, and the invention is not limited thereto.

Figure 4:
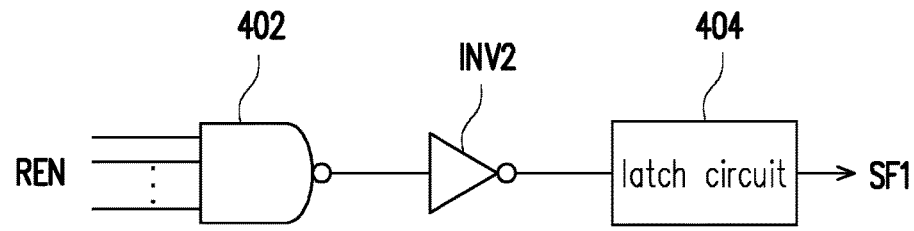
FIG. 4 is a schematic view of a flag signal generation circuit according to an embodiment of the invention.

In some embodiments, the control circuit 104 may determine whether the memory cells in the memory sector need refreshing (such as determining for one time whether 32 of the memory cells need refreshing, but the invention is not limited thereto) in a batch manner to heighten the efficiency of refreshing the nonvolatile memory apparatus 100. For example, the control circuit 104 may include a plurality of the sense circuits (such as 32 sense circuits, but the invention is not limited thereto) and a flag signal generation circuit 400 as shown in FIG. 4. The flag signal generation circuit 400 may receive the refresh enable signals REN output respectively by the plurality of sense circuits and output a flag signal SF1. The control circuit 104 may determine whether any of the memory cells that needs refreshing is present among the memory cells to which the refresh enable signals REN correspond based on the flag signal SF1. Specifically, the flag signal generation circuit 400 may include, for example, a NAND gate circuit 402, an inverting gate INV2 and a latch circuit 404. An input end of the NAND gate circuit 402 receives the refresh enable signals REN output by the plurality of sense circuits, an input end of the inverting gate INV2 is coupled to an input end of the NAND gate circuit 402, and the latch circuit 404 is coupled to an output end of the inverting gate INV to latch an output signal from the inverting gate INV2 to generate the flag signal SF1. When all the refresh enable signals REN are the logic "1", and the flag signal SF1 is the logic "1", it means that the memory cells to which all the sense circuits correspond do not need refreshing. The control circuit 104 may control the sense circuits to generate the refresh enable signals REN based on a next batch of the memory cells to determine whether the next batch of memory cells needs refreshing, so the required time of the refresh operation is shortened. When any of the refresh enable signals REN is the logic "0", and the flag signal SF1 is the logic "0", it means that the memory cell that needs refreshing is among the memory cells to which the sense circuits correspond. After refreshing the memory cell that needs refreshing, the control circuit 104 controls the sense circuits to generate the refresh enable signals REN based on the next batch of memory cells and then determine whether the next batch of memory cells needs refreshing.

Figure 5:
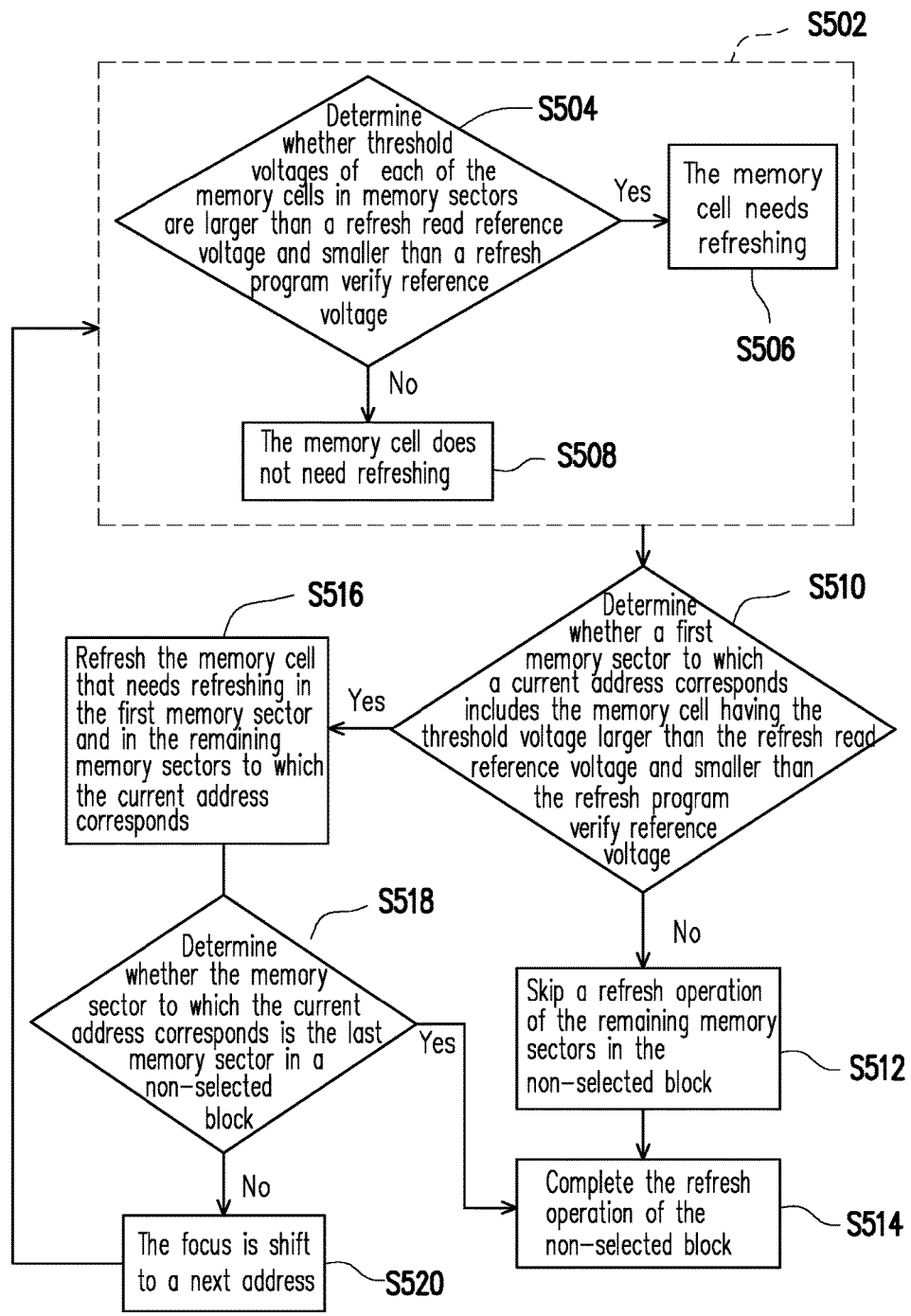
FIG. 5 is a flowchart of a method of refreshing a non-volatile memory apparatus according to an embodiment of the invention.

FIG. 5 is a flowchart of steps of a method of refreshing the non-volatile memory apparatus according to an embodiment of the invention. Referring to FIG. 5, in view of the embodiment, the method of refreshing the non-volatile memory apparatus may include the following steps: firstly, whether the memory cells in the memory sector need refreshing are determined based on whether the threshold voltages of the memory cells in the memory sector fall within a specific range of voltage (step S502). For example, it is possible to determine whether the threshold voltage of each of the memory cells in the memory sector are larger than the refresh read reference voltage and smaller than the refresh program verify reference voltage (step S504). If a threshold voltage of a memory cell is larger than the refresh read reference voltage and smaller than the refresh program verify reference voltage, it is determined that the memory cell needs refreshing (step S506); if the threshold voltage of the memory cell is neither larger than the refresh read reference voltage nor smaller than the refresh program verify reference voltage, it is determined that the memory cell does not need refreshing (step S508). The embodiment, for example, may be implemented by determining whether the sensed voltage obtained by refreshing and reading the memory cell is between the first reference voltage and the second reference voltage. If the sensed voltage is between the first reference voltage and the second reference voltage, it means that the memory cell needs refreshing. Values of the first reference voltage and the second reference voltage may be set up with reference to values of the refresh read reference voltage and refresh program verify reference voltage, but the invention is not limited thereto. In some embodiments, whether the plurality of memory cells need refreshing at the same time may be determined in a batch manner.

Then, whether the first memory sector to which the current address corresponds includes the memory cell having the threshold voltage larger than the refresh read reference voltage and smaller than the refresh program verify reference voltage is determined (step S510). If the first memory sector to which the current address corresponds does not include the memory cell having the threshold voltage larger than the refresh read reference voltage and smaller than the refresh program verify reference voltage, the refresh operation of the remaining memory sectors in the non-selected block may be skipped (step S512) to complete the refresh operation of the non-selected block (step S514); if the first memory sector to which the current address corresponds includes the memory cell having the threshold voltage larger than the refresh read reference voltage and smaller than the refresh program verify reference voltage, the memory cell that needs refreshing in the first memory sector and in the remaining memory sectors to which the current address corresponds is refreshed (step S516). After the refresh operation of the memory sector to which the current address corresponds is completed, whether the memory sector to which the current address corresponds is the last memory sector in the non-selected block is determined (step S518). If so, step 514 is taken to complete the refresh operation of the non-selected block; if not, the focus is shifted to a next address (step S520), and step S502 is taken again to determine whether the memory cells in the memory sector to which the next address corresponds needs refreshing.

Based on the above, the embodiments of the invention show that whether the memory cells need refreshing are determined based on whether the threshold voltages of the memory cells in the memory sectors are larger than the refresh read reference voltage and smaller than the refresh program verify reference voltage, so it is possible to further avoid refreshing the memory cell that does not need refreshing to heighten the efficiency of refreshing the non-volatile memory apparatus and prevent the problems of a deficiency in a driving voltage of bit lines, poorer characteristics of data storage and erroneous refreshed data led to by the memory cell having a lower threshold voltage, a higher threshold voltage or a low transduction value. In this connection, the stored data are guaranteed correct after the memory cell is refreshed. In addition, in some embodiments, when none of the threshold voltages of all the memory cells in the first memory sector to which the current address corresponds is between the refresh read reference voltage and the refresh program verify reference voltage, the refresh operation of the remaining memory sectors in the non-selected block may be skipped directly to complete the refresh operation of the non-selected block. Therefore, the required time of the refresh operation is shortened, and the efficiency of refreshing the non-volatile memory apparatus is heightened.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory apparatus, comprising:
a non-volatile memory; and
a control circuit, coupled to the non-volatile memory and refreshing a non-selected block when an erasing operation is performed, wherein the non-selected block comprises a plurality of memory sectors, each of the memory sectors comprises a plurality of memory cells, and the control circuit determines whether threshold voltages of the memory cells in the memory sectors are larger than a refresh read reference voltage and smaller than a refresh program verify reference voltage, wherein the control circuit determines that a memory cell needs refreshing if the threshold voltage of the memory cell is larger than the refresh read reference voltage and smaller than the refresh program verify reference voltage,
wherein the control circuit further determines whether a first memory sector to which a current address corresponds comprises the memory cell having the threshold voltage larger than the refresh read reference voltage and smaller than the refresh program verify reference voltage, and if the first memory sector to which the current address corresponds does not comprise the memory cell having the threshold voltage larger than the refresh read reference voltage and smaller than the refresh program verify reference voltage, a refresh operation of the remaining memory sectors in the non-selected block is skipped to complete the refresh operation of the non-selected block.

2. The non-volatile memory apparatus of claim 1, wherein if the first memory sector to which the current address corresponds comprises the memory cell having the threshold voltage larger than the refresh read reference voltage and smaller than the refresh program verify reference voltage, the control circuit refreshes the memory cell that needs refreshing in the first memory sector and in the remaining memory sectors to which the current address corresponds.

3. The non-volatile memory apparatus of claim 1, wherein the control circuit determines whether the memory cells need refreshing in a batch manner.

4. The non-volatile memory apparatus of claim 1, wherein the control circuit comprises a plurality of sense circuits, each of the sense circuits comprising:
a first sense amplifier having a positive end and a negative end receiving a sensed voltage corresponding to stored data of a target sensed memory cell and a first reference voltage respectively;
a second sense amplifier having a positive end and a negative end receiving the corresponding sensed voltage and a second reference voltage; and
a refresh enable circuit, coupled to the first sense amplifier and the second sense amplifier and outputting a refresh enable signal which enables the control circuit to refresh the target sensed memory cell according to a comparison result of the first sense amplifier and the second sense amplifier.

5. The non-volatile memory apparatus of claim 4, wherein the control circuit further comprises:
a flag signal generation circuit, coupled to the sensed circuits and generating a flag signal according to the refresh enable signal output by the sense circuits, wherein the control circuit determines whether any of the memory cells to which the sense circuits correspond needs refreshing according to the flag signal.

6. The non-volatile memory apparatus of claim 5, wherein the flag signal generation circuit comprises:
a NAND gate circuit having an input end receiving the refresh enable signal output by the sense circuits;
an inverting gate having an input end coupled to an output end of the NAND gate circuit; and
a latch circuit, coupled to an output end of the inverting gate to latch an output signal of the inverting gate and generate the flag signal.

7. A method of refreshing a non-volatile memory apparatus suitable for refreshing a non-selected block when an erasing operation is performed, wherein the non-selected block comprises a plurality of memory sectors, and each of the memory sectors comprises a plurality of memory cells, the method comprising:
determining whether threshold voltages of the memory cells in the memory sectors are larger than a refresh read reference voltage and smaller than a refresh program verify reference voltage; and
determining that a memory cell needs refreshing if the threshold voltage of the memory cell is larger than the refresh read reference voltage and smaller than the refresh program verify reference voltage, determining whether a first memory sector to which a current address corresponds comprises the memory cell having the threshold voltage larger than the refresh read reference voltage and smaller than the refresh program verify reference voltage; and
skipping a refresh operation of the remaining memory sectors in the non-selected block to complete the refresh operation of the non-selected block if the first memory sector to which the current address corresponds does not comprise the memory cell having the threshold voltage larger than the refresh read reference voltage and smaller than the refresh program verify reference voltage.

8. The method of claim 7, wherein if the first memory sector to which the current address corresponds comprises the memory cell having the threshold voltage larger than the refresh read reference voltage and smaller than the refresh program verify reference voltage, the memory cell that needs refreshing in the first memory sector and in the remaining memory sectors to which the current address corresponds is refreshed.

9. The method of claim 7, comprising:
determining whether the memory cells need refreshing in a batch manner.

* * * * *